United States Patent
Houweling et al.

(10) Patent No.: US 11,237,475 B2
(45) Date of Patent: Feb. 1, 2022

(54) EUV PELLICLES

(71) Applicant: ASML NETHERLANDS B.V., Veldhoven (NL)

(72) Inventors: Zomer Silvester Houweling, Utrecht (NL); Chaitanya Krishna Ande, Eindhoven (NL); Dennis De Graaf, Waalre (NL); Thijs Kater, Eindhoven (NL); Michael Alfred Josephus Kuijken, Son en Breugel (NL); Mahdiar Valefi, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 97 days.

(21) Appl. No.: 16/758,250

(22) PCT Filed: Nov. 6, 2018

(86) PCT No.: PCT/EP2018/080219
§ 371 (c)(1),
(2) Date: Apr. 22, 2020

(87) PCT Pub. No.: WO2019/091932
PCT Pub. Date: May 16, 2019

(65) Prior Publication Data
US 2020/0341365 A1 Oct. 29, 2020

(30) Foreign Application Priority Data
Nov. 10, 2017 (EP) .................................... 17201126
Mar. 29, 2018 (EP) .................................... 18165122

(51) Int. Cl.
G03F 1/62 (2012.01)

(52) U.S. Cl.
CPC ..................................... G03F 1/62 (2013.01)

(58) Field of Classification Search
CPC ......................................................... G03F 1/62
USPC ............................................................. 430/5
See application file for complete search history.

(56) References Cited

U.S. PATENT DOCUMENTS

| 2002/0039689 | A1 | 4/2002 | Yusa et al. |
| 2011/0249243 | A1 | 10/2011 | Sjmaenok et al. |
| 2016/0246179 | A1 | 8/2016 | Huber |
| 2017/0176850 | A1 | 6/2017 | Chen et al. |

OTHER PUBLICATIONS

International Search Report and Written Opinion issued in corresponding PCT Patent Application No. PCT/EP2018/080219, dated Jan. 3, 2019.

*Primary Examiner* — Christopher G Young
(74) *Attorney, Agent, or Firm* — Pillsbury Winthrop Shaw Pittman LLP

(57) ABSTRACT

A pellicle having a metal oxysilicide layer. A pellicle having a molybdenum layer, a ruthenium layer and a silicon oxynitride layer, wherein the molybdenum layer is disposed between the ruthenium layer and the silicon oxynitride layer. A method of manufacturing a pellicle for a lithographic apparatus, the method including providing a metal oxysilicide layer. A lithographic assembly including a pellicle having a metal oxysilicide layer. The use of a pellicle having a metal oxysilicide layer in a lithographic apparatus.

20 Claims, 1 Drawing Sheet

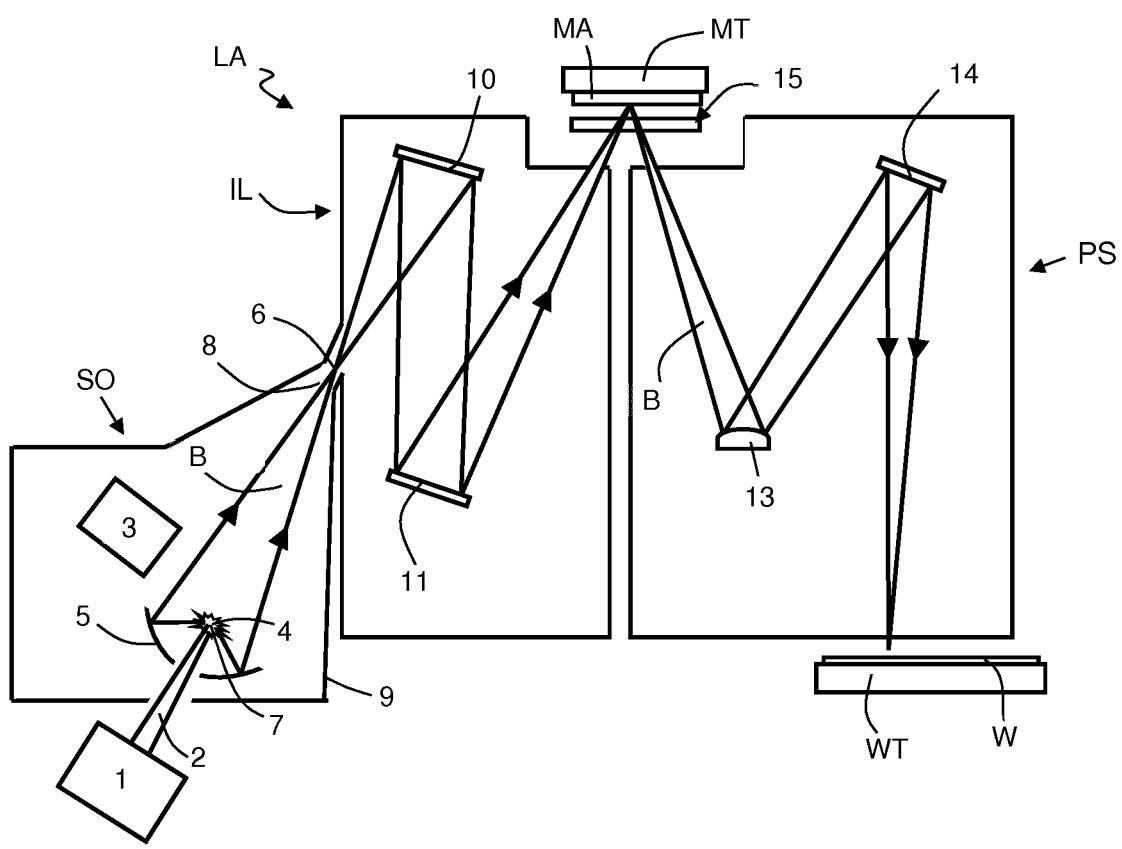

EUV PELLICLES

CROSS-REFERENCE TO RELATED APPLICATIONS

This application is the U.S. national phase entry of PCT Patent Application No. PCT/EP2018/080219, which was filed on Nov. 6, 2018, which claims the benefit of priority of European Patent Application No. 17201126.4 which was filed on Nov. 10, 2017 and of European Patent Application No. 18165122.5 which was filed on Mar. 29, 2018 which are incorporated herein in their entireties its entirety by reference.

FIELD

The present invention relates to a pellicle for a lithographic apparatus, a method of manufacturing a pellicle for a lithographic apparatus, and a lithographic apparatus comprising a pellicle, as well as uses therefor.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

A lithographic apparatus includes a patterning device (e.g. a mask or reticle). Radiation is provided through or reflected off the patterning device to form an image on a substrate. A pellicle may be provided to protect the patterning device from airborne particles and other forms of contamination. Contamination on the surface of the patterning device can cause manufacturing defects on the substrate.

Pellicles may also be provided for protecting optical components other than patterning devices. Pellicles may also be used to provide a passage for lithographic radiation between regions of the lithography apparatus which are sealed from one another. Pellicles may also be used as filters, such as spectral purity filters. Due to the sometimes harsh environment inside a lithography apparatus, particularly an EUV lithography apparatus, pellicles are required to demonstrate excellent chemical and thermal stability.

Known pellicles may comprise, for example, a freestanding membrane such as a silicon membrane, silicon nitride, graphene or graphene derivatives, carbon nanotube, or other membrane materials. A mask assembly may include the pellicle which protects a patterning device (e.g. a mask) from particle contamination. The pellicle may be supported by a pellicle frame, forming a pellicle assembly. The pellicle may be attached to the frame, for example, by gluing a pellicle border region to the frame. The frame may be permanently or releasably attached to a patterning device.

During use, the temperature of a pellicle in a lithographic apparatus increases to anywhere from around 500 up to 1000° C. or higher. These high temperatures can damage the pellicle and it is therefore desirable to improve ways by which to dissipate the heat in order to lower the operating temperature of the pellicle and improve pellicle lifespan.

One way in which this has been attempted is by applying a thin metallic film (a coating layer) on the pellicle, for example a ruthenium film. The metallic film increases the emissivity of the pellicle and thereby raises the rate at which heat is emitted from the pellicle, thereby causing the equilibrium temperature at which the pellicle emits heat at the same rate as it absorbs heat to be decreased.

However, it is known that metallic films deposited at a relatively low temperature on an inert substrate are in an energetically unfavourable state and the heating or annealing of a thin metallic film on a substrate leads to thermal instability at temperatures well below the melting point of the metallic film. As such, when the metallic films are heated, sufficient energy is provided to cause the formation of holes in the metallic film, which form via a surface diffusion process. The holes grow and eventually coalesce to form irregularly shaped islands. This process of a film rupturing to form holes and ultimately islands or droplets is known as dewetting. Although this process may be beneficial in certain circumstances, such as for the formation of catalyst particles for the growth of carbon nanotubes, in other fields this is highly undesirable. For example, in the field of microelectronics, dewetting causes electrical interconnections to fail, and for pellicles, such as EUV pellicles, the dewetting alters the functionality of the emissive metallic layer. It is therefore an object of the present invention to retard or prevent dewetting of metallic films.

Since the metallic layer increases the thermal emissivity of the pellicle, as the pellicle heats up, the metallic film radiates and controls the temperature of the pellicle. When the metallic film dewets to form islands, the emissivity drops very rapidly to negligible values bringing about a significant temperature rise and consequent pellicle failure.

It is known from the literature relating to thermal dewetting of metallic films that the dewetting process always starts with the formation of holes in the metallic film, provided these are not already present. The material forming the edges of the holes is acted on by capillary forces that tend to expand the holes such that the edges of adjacent holes eventually coalesce and form material strands. As the annealing proceeds and sufficient energy is applied, these material strands break up into islands. The average size of the islands of the metallic film is proportional to the initial thickness of the metal film, also the size of the islands increases with the anneal duration, whereby larger islands grow in size at the expense of smaller islands through atomic migration of the metal species over the substrate. This description of dewetting applies generally to metallic films of thicknesses of hundreds of nanometers down to about 10 nm on an inert substrate.

For the case of Ru nanocoatings on EUV pellicles with a $SiO_xN_y$ capping layer, this evolution of the Ru morphology also holds provided that the Ru thickness is below a threshold thickness. The silicon oxynitride capping layer serves as a chemical-etch retardant layer. Thus, below the threshold value, thicker Ru and longer anneals yield the breakup of the Ru layer into islands with increasingly larger sizes. The threshold thickness is not universal and the exact value for it depends on several factors, amongst which, the mass density of the Ru layer and the atomic composition of the $SiO_xN_y$ cap layer, are key. The threshold thickness lies between 0 and 10 nm. In one case, it has been found that the Ru threshold thickness is about 4.5 nm, but, as mentioned, this is a value specific to the applied material preparation and annealing conditions. For Ru thicknesses above the threshold value, the dewetting process is either halted at the hole formation stage or at the material strand formation stage, depending on the attained pellicle temperature. The Ru on EUV pellicles allows significantly higher temperatures before hole formation or islanding occurs than the literature reports for dewetting on inert substrates. This indicates that atomic migration of the metallic species over the external pellicle surface is greatly attenuated. This surprising realisation is central for the current invention.

Even though the ruthenium film of a thickness exceeding the specific threshold thickness is stable in the operating conditions of an EUV lithography apparatus, the thickness of the metallic layer causes the pellicle to absorb more of the incident EUV radiation and therefore the EUV transmissivity of the pellicle is reduced. The reduced amount of EUV radiation which is able to pass through the pellicle means that the throughput of the lithography apparatus is reduced as longer exposure times are required. Of course, it is possible to increase the EUV transmissivity of the pellicle by reducing the thickness of the metallic layer, but this causes the undesirable dewetting of the metallic layer as described above, which results in overheating and ultimate failure of the pellicle.

It is therefore desirable to provide a method of manufacturing a pellicle which is able to withstand the operating conditions of a lithography apparatus, particularly EUV lithographic apparatus, and which has sufficient EUV transmissivity to allow high scanner yield, namely the number of exposed wafers per hour. It is also desirable to provide a pellicle which is thermally and chemically stable, and which demonstrates acceptable EUV transmissivity.

Whilst the present application generally refers to pellicles in the context of lithography apparatus, in particular EUV lithography apparatus, the invention is not limited to only pellicles and lithography apparatus, and it is appreciated that the subject matter of the present invention may be used in any other suitable apparatus or circumstances.

For example, the methods of the present invention may equally be applied to spectral purity filters, which are a type of pellicle. EUV sources, such as those which generate EUV radiation using a plasma, in practice do not only emit desired 'in-band' EUV radiation, but also undesirable (out-of-band) radiation. This out-of-band radiation is most notably in the deep UV (DUV) radiation range (from 100 to 400 nm). Moreover, in the case of some EUV sources, for example laser produced plasma EUV sources, the radiation from the laser, usually at 10.6 microns, may also form a significant source of undesirable (out-of-band) infrared (IR) radiation.

In a lithographic apparatus, spectral purity may be desired for several reasons. One reason is that resist is sensitive to out of-band wavelengths of radiation, and thus the image quality of exposure patterns applied to the resist may be deteriorated if the resist is exposed to such out-of-band radiation. Furthermore, out-of-band infrared radiation, for example the 10.6 micron radiation in some laser produced plasma sources, leads to unwanted and unnecessary heating of the patterning device, substrate, and optics within the lithographic apparatus. Such heating may lead to damage of these elements, degradation in their lifetime, and/or defects or distortions in patterns projected onto and applied to a resist-coated substrate.

A spectral purity filter may be formed, for example, from a silicon membrane that is coated with a reflective metal, such as molybdenum or ruthenium. In use, a typical spectral purity filter might be subjected to a high heat load from, for example, incident infrared and EUV radiation. The heat load might result in the temperature of the spectral purity filter being above 800° C., which results in eventual delamination or dewetting of the coating. Delamination and degradation of the silicon membrane may be accelerated by the presence of hydrogen, which is often used as a gas in the environment in which the spectral purity filter is used in order to suppress debris (e.g. molecular outgassing from resists, or particles debris or the like), from entering or leaving certain parts of the lithographic apparatus. Thus, the spectral purity filter may be used as a pellicle, and vice versa. Therefore, reference in the present application to a 'pellicle' is also reference to a 'spectral purity filter'. Although reference is primarily made to pellicles in the present application, all of the features could equally be applied to spectral purity filters. It is understood that spectral purity filters are a type of pellicle.

In a lithographic apparatus (and/or method) it is desirable to minimise the losses in intensity of radiation which is being used to apply a pattern to a resist coated substrate. One reason for this is that, ideally, as much radiation as possible should be available for applying a pattern to a substrate, for instance to reduce the exposure time and increase throughput. At the same time, it is desirable to minimise the amount of undesirable radiation (e.g. out-of-band) radiation that is passing through the lithographic apparatus and which is incident upon the substrate. Furthermore, it is desirable to ensure that a pellicle used in a lithographic method or apparatus has an adequate lifetime, and does not degrade rapidly over time as a consequence of the high heat load to which the pellicle may be exposed, and/or the hydrogen (or the like, such as free radical species including H* and HO*) to which the pellicle may be exposed. It is therefore desirable to provide an improved (or alternative) pellicle, and for example a pellicle suitable for use in a lithographic apparatus and/or method.

SUMMARY

The present invention has been made in consideration of the aforementioned problems with known pellicles and known methods of producing pellicles.

According to a first aspect of the present invention, there is provided a pellicle for a lithographic apparatus, wherein the pellicle comprises a metal oxysilicide layer. The metal oxysilicide layer may serve as an external surface atomic migration attenuator.

The pellicle may comprise a silicon layer or substrate. The silicon layer or substrate may serve as a core layer that provides mechanical pre-tension and robustness. Silicon may be used as the substrate as it is possible to manufacture silicon wafers that are able to self-support using known techniques. It is also possible to manufacture silicon wafers which are large enough to be used as pellicles. An advantage of using silicon in an EUV lithography apparatus is that silicon absorbs little of the EUV radiation passing through the pellicle. Even so, the emissivity of silicon is lower than other materials, so although it does not absorb EUV radiation to a high degree, the silicon radiates heat relatively slowly and therefore heats up when EUV radiation is passed through.

The pellicle may comprise a metallic layer. The metallic layer may serve as a thermal emissivity enhancing layer. The metallic layer has higher emissivity than silicon, and therefore serves to cool the silicon by increasing the rate at which heat is radiated away from the pellicle.

The metal oxysilicide layer may be disposed between the silicon substrate and the metallic layer. Without wishing to be bound by scientific theory, observations from dedicated laser annealing experiments on Ru-coated pellicles indicate that the presence of the interfacial metal oxysilicide layer serves to anchor the metallic species to the silicon substrate and to prevent dewetting of the metallic layer.

The metal in the metal oxysilicide interfacial layer may be the same as the metal in the metallic layer. It is preferable to use the same metal in both the metal oxysilicide interfacial layer and the metallic layer to maximize the interaction between the two layers and the degree to which the metallic layer is anchored.

The metal may be any suitable metal. A suitable metal is one which has high emissivity and which has low EUV absorption characteristics and which does not readily oxidise, and if it does, then also readily reduces back to its metallic state, or if it oxidises but does not readily reduce back to its metallic state that it at least has an oxide that provides emissivity. The metal may be selected from ruthenium, zirconium, hafnium, and/or combinations thereof. Preferably, the metal is ruthenium since it is thermally conductive in its metallic form as well as in its oxidized form. Although the atmosphere in which the pellicle is operated is at a reduced pressure and mainly comprises hydrogen gas, due to the high temperature of the pellicle when in use, the metallic layer can react with any oxygen present. For most metals, the oxide has much lower emissivity than the metallic form, so oxidation of the metal can lower the performance of the pellicle. However, since ruthenium oxide is thermally conductive and has good emissivity, it is still able to radiate heat away and the performance of the pellicle is maintained.

The thickness of the metallic layer may be less than or equal to around 6 nm, preferably less than or equal to around 5 nm, more preferably less than or equal to around 4.5 nm, and even more preferably less than or equal to around 3.5 nm. It has been tested that a metallic layer with a thickness of greater than around 4.5 nm is resistant to dewetting, but offers lower EUV transmissivity. Whilst the lower transmissivity may be acceptable in order to allow the thickness of the metallic layer to be increased to extend the lifespan of the pellicle, it is desirable to have a thinner metallic layer whilst maintaining the resistance to dewetting. Due to the metal oxysilicide interfacial layer stabilising the metallic layer, it has been surprisingly realised that a thinner metallic layer may be used without dewetting than has previously been the case, i.e also for films with a thickness less than 4.5 nm The metallic layer may be on a single side of the silicon substrate. It has been found that providing a metallic layer on one side of the silicon substrate is sufficient to increase the emissivity of the pellicle whilst maintaining acceptable EUV transmissivity.

The silicon substrate may comprise a silicon oxynitride capping layer. The silicon oxynitride capping layer may be able to react with the metallic layer in order to form the metal oxysilicide layer. As such, the silicon oxynitride layer may fully react to form the metal oxysilicide layer, or may only partially react.

In an embodiment, the pellicle may comprise molybdenum. The molybdenum is preferably disposed between a metallic ruthenium layer and a silicon substrate. Preferably, the molybdenum is disposed at the interface of the metallic ruthenium layer and a silicon oxynitride layer. The silicon oxynitride layer is preferably disposed on the surface of the silicon substrate. The molybdenum may be provided as a layer. The molybdenum may be provided on one or both faces of the pellicle. In particular, the silicon substrate may form a central core having two faces and each face may be provided with a silicon oxynitride layer. The molybdenum layer may be provided on the silicon oxynitride layer. The molybdenum may be provided on one or both silicon oxynitride layers. Where the molybdenum is provided on just one of the silicon oxynitride layers, in use, the pellicle is oriented such that the face comprising the molybdenum is facing the reticle. It will be appreciated that the reverse orientation is also contemplated.

It has been surprisingly found that the presence of molybdenum not only improves the reflectivity of the pellicle, but also acts as a barrier at the interface of the ruthenium and silicon oxynitride layers and prevents oxidation and intermixing of the pellicle at operating temperatures. Pellicles which comprise molybdenum at the interface between the ruthenium and the silicon oxynitride layers do not show dewetting, even after exposure to temperatures in excess of 500° C. In addition, the molybdenum may be at least partially oxidised, which avoids the ruthenium reacting with the silicon to form ruthenium silicide ($Ru_2Si_3$). During testing in conditions similar to the scanner conditions, a pellicle according to the present invention has been found to have a loss of transmissivity of less than 1% after being used to image more than 10,000 wafers.

As such, in one embodiment, there is provided a pellicle for a lithographic apparatus, wherein the pellicle comprises a silicon oxynitride layer, a molybdenum layer, and a ruthenium layer. The ruthenium and/or molybdenum layers may be metallic.

The molybdenum layer is located between the silicon oxynitride layer and the ruthenium layer. The silicon oxynitride layer may react partially or fully to provide a ruthenium oxysilicide layer. Thus, the silicon oxynitride layer may have been at least partially converted to a ruthenium oxysilicide layer and the pellicle may comprise a ruthenium oxysilicide layer instead of or in addition to a silicon oxynitride layer. The silicon oxynitride layer may be provided on a silicon substrate, which may be a polycrystalline silicon substrate. In summary, the pellicle of the present invention may comprise a ruthenium oxysilicide interfacial layer located between a silicon substrate and a metallic ruthenium layer. The ruthenium oxysilicide interfacial layer serves to prevent dewetting of the metallic ruthenium layer, thereby allowing a thinner ruthenium layer to be applied. This results in a more stable pellicle which has improved EUV transmissivity compared to known pellicles. In addition, pellicles which comprise a molybdenum layer further resists dewetting when exposed to the conditions to which the pellicle is subjected to during use.

According to a second aspect of the present invention, there is provided a method of manufacturing a pellicle for a lithographic apparatus, said method comprising providing a metal oxysilicide layer.

It has been surprisingly found that a metal oxysilicide layer can prevent dewetting of an overlying metallic layer. This prevents premature failure of the metallic layer and the pellicle, and also allows for a thinner metallic layer to be used, thus allowing a greater proportion of incident EUV radiation to pass through the pellicle.

The metal oxysilicide layer may be provided by any suitable means. For example, where the pellicle comprises a silicon substrate and a metallic layer, the metal oxysilicide may be provided by heating the pellicle to a temperature below the temperature at which dewetting occurs for a first period of time. The silicon substrate preferably comprises a silicon oxynitride capping layer.

If the pellicle is heated to a temperature higher than the temperature at which dewetting occurs, the metallic layer will dewet before it has reacted with the silicon substrate and/or the silicon oxynitride capping layer. As such, by heating the pellicle to a temperature below the temperature at which dewetting occurs, this will allow the metal oxysilicide layer to form. Once the metal oxysilicide layer has formed, it is possible to heat the pellicle up to temperatures higher than those which would have previously caused dewetting as the metal oxysilicide layer stabilizes the metallic layer. In use, the pellicle heats up very rapidly and so passes the dewetting temperature very shortly after the EUV radiation is turned on.

The temperature at which dewetting occurs will depend on the thickness of the metallic layer as well as the nature of the substrate onto which the metallic layer is attached. The skilled person would be able to determine the dewetting temperature of any given combination of metallic layer and substrate by heating the pellicle until dewetting is observed.

The pellicle is preferably heated to below the dewetting temperature for a sufficient time to allow the metal oxysilicide layer to form. As the metal oxysilicide layer takes time to form, the pellicle needs to be held at the required temperature for a period of time sufficient to allow the metal oxysilicide layer to form.

The heating may be effected by any suitable means. The heating could be effected by putting the pellicle into a heating chamber, but is preferably effected by exposing the pellicle to laser radiation. Preferably the power used is around 125 $W_{eq}$ or below. Hereby 125 $W_{eq}$ is defined as a power equivalent to the power incident on the pellicle in a lithographic apparatus operating at 125 W at an intermediate focus, as discussed below.

Following the reaction to form the metal oxysilicide, additional metal may be applied to the pellicle in order to take account of or replace any metal which has reacted to form the metal oxysilicide layer. In this way the required thickness of the metallic layer can be achieved.

In an alternative embodiment, the metal oxysilicide layer is formed by sputtering. A metal target may be sputtered using known techniques to be deposited on a silicon substrate. The composition of the plasma used in the sputtering can be modified to changes the properties of the film. For example, the plasma may comprise oxygen which reacts with the metal and the silicon to form the metal oxysilicide layer.

Once the metal oxysilicide layer has formed, a metallic layer may be formed on the metal oxysilicide layer. The metallic layer may comprise ruthenium. A metallic layer comprising molybdenum may be provided between the silicon oxynitride layer and the ruthenium layer.

According to a third aspect of the present invention, there is provided an assembly for a lithographic apparatus comprising a pellicle according to the first or second aspects of the present invention, a frame for supporting the pellicle and a patterning device attached to the frame.

According to a fourth aspect of the present invention, there is provided the use of a pellicle according to the first or second aspects of the present invention in a lithographic apparatus.

The features described in respect of any of the aspects may be combined with the features described in respect of any of the other aspects of the present invention. For example, the features of the pellicle according to first aspect of the present invention may be combined with any features according to the second aspect of the present invention and vice versa.

The present invention will now be described with reference to an EUV lithography apparatus. However, it will be appreciated that the present invention is not limited to pellicles and is equally applicable to spectral purity filters.

BRIEF DESCRIPTION OF THE DRAWINGS

Embodiments of the invention will now be described, by way of example only, with reference to the accompanying schematic drawings, in which:

FIG. 1 depicts a lithographic system comprising a lithographic apparatus and a radiation source according to an embodiment of the invention.

DETAILED DESCRIPTION

FIG. 1 shows a lithographic system including a pellicle 15 according to the first aspect of the present invention or manufactured according to the methods of the second aspect of the present invention according to one embodiment of the invention. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W. In this embodiment, the pellicle 15 is depicted in the path of the radiation and protecting the patterning device MA. It will be appreciated that the pellicle 15 may be located in any required position and may be used to protect any of the mirrors in the lithographic apparatus.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type which may be referred to as a laser produced plasma (LPP) source. A laser 1, which may for example be a $CO_2$ laser, is arranged to deposit energy via a laser beam 2 into a fuel, such as tin (Sn) which is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure which is arranged to reflect EUV radiation (e.g. EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

The laser 1 may be separated from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors 13, 14 which are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors 13, 14 in FIG. 1, the projection system may include any number of mirrors (e.g. six mirrors).

The radiation sources SO shown in FIG. 1 may include components which are not illustrated. For example, a spectral filter may be provided in the radiation source. The spectral filter may be substantially transmissive for EUV radiation but substantially blocking for other wavelengths of radiation such as infrared radiation. Indeed, the spectral filter may be a pellicle according to any aspect of the present invention.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

An exemplary pellicle according to an aspect of the present invention comprises a silicon substrate, a ruthenium oxysilicide interfacial layer, and a metallic ruthenium layer. In another exemplary pellicle, a molybdenum layer may be provided between a layer of silicon oxynitride on the silicon substrate, and the metallic ruthenium layer. The silicon substrate provides support and strength for the pellicle whilst the metallic ruthenium layer serves to increase the emissivity of the pellicle, thereby extending the lifespan of the pellicle and allowing it to operate at higher powers than known pellicles. The ruthenium oxysilicide layer serves to anchor the metallic ruthenium and stops or at least reduces the tendency of the ruthenium metal to dewet. The molybdenum layer also improves the emissivity of the pellicle and also acts as a barrier to further suppress the dewetting of ruthenium at high temperatures, thereby increasing the lifetime of the pellicle. This also allows the pellicle to be used at higher powers without degradation in performance.

Embodiments are provided according to the following clauses:

1. A pellicle for a lithographic apparatus, wherein the pellicle comprises a metal oxysilicide layer.
2. A pellicle according to Clause 1, wherein the pellicle comprises a silicon substrate.
3. A pellicle according to Clause 1 or Clause 2, wherein the pellicle comprises a metallic layer.
4. A pellicle according to Clause 3, wherein the metal oxysilicide layer is disposed between the silicon substrate and the metallic layer.
5. A pellicle according to Clause 4, wherein the metal in the metallic layer and in the metal oxysilicide is the same.
6. A pellicle according to Clause 5, wherein the metal is selected from ruthenium, zirconium, and/or hafnium.
7. A pellicle according to Clause 6, wherein the metal is ruthenium.
8. A pellicle according to any of Clauses 3 to 7, wherein the thickness of the metallic layer is less than or equal to around 6 nm, preferably less than or equal to around 5 nm, more preferably less than or equal to around 4.5 nm, and even more preferably less than or equal to around 3.5 nm.
9. A pellicle according to any of Clauses 3 to 8, wherein the metallic layer is on a single side of the silicon substrate.
10. A pellicle according to any of Clauses 1 to 9, wherein the pellicle comprises a silicon oxynitride capping layer.
11. A pellicle according to Clause 10, wherein the silicon oxynitride capping layer is disposed on a or the silicon substrate.
12. A pellicle according to any of Clauses 1 to 11, wherein the pellicle further comprises a molybdenum layer.
13. A pellicle according to any of Clause 1 to 12, wherein the pellicle further comprises a silicon oxynitride layer.
14. A pellicle according to Clause 13 when dependent on Clause 12, wherein the molybdenum layer is disposed between the silicon oxynitride layer and the ruthenium layer.
15. A pellicle for a lithographic apparatus comprising a molybdenum layer disposed between a ruthenium layer and a silicon oxynitride layer.
16. The pellicle of Clause 15, wherein one or both of the molybdenum and ruthenium layers is metallic.
17. The pellicle of Clause 16, wherein the silicon oxynitride layer is disposed on a silicon substrate, preferably a polycrystalline silicon substrate.
18. A method of manufacturing a pellicle for a lithographic apparatus, said method comprising providing a metal oxysilicide layer.
19. A method according to Clause 18, wherein the pellicle comprises a silicon substrate and a metallic layer, and wherein the metal oxysilicide layer is formed by heating the pellicle to a temperature below the temperature at which dewetting occurs for a first period of time.

20. A method according to Clause 19, wherein the first period of time is sufficient for the metal oxysilicide layer to form.

21. A method according to Clause 19 or Clause 20, wherein the heating is effected using laser radiation, preferably wherein the power is around 125 $W_{eq}$ or below.

22. A method according to Clause 18, wherein the metal oxysilicide layer is formed by sputtering.

23. A method according to any of Clause 19 to 22, wherein the metallic layer is formed on the metal oxysilicide layer after the metal oxysilicide layer has formed.

24. A method according to any of Clauses 19 to 23, wherein the metallic layer comprises ruthenium.

25. A method according to any of Clause 19 to 24, wherein the method further comprises providing a molybdenum layer between the silicon substrate and the ruthenium layer.

26. A method of manufacturing a pellicle for a lithographic apparatus, said method comprising providing a molybdenum layer disposed between a ruthenium layer and a silicon oxynitride layer.

27. An assembly for a lithographic apparatus comprising a pellicle according to any of Clauses 1 to 26, a frame for supporting the pellicle and a patterning device attached to the frame.

28. Use of a pellicle according to any of Clauses 1 to 27 in a lithographic apparatus.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A pellicle for a lithographic apparatus, the pellicle comprising a metal oxysilicide layer.

2. The pellicle according to claim 1, further comprising a silicon substrate.

3. The pellicle according to claim 1, further comprising a metallic layer.

4. The pellicle according to claim 3, wherein the metal oxysilicide layer is disposed between a silicon substrate and the metallic layer.

5. The pellicle according to claim 4, wherein a metal in the metallic layer and in the metal oxysilicide layer is the same.

6. The pellicle according to claim 5, wherein the metal is selected from ruthenium, zirconium, and/or hafnium.

7. The pellicle according to claim 1, further comprising a silicon oxynitride capping layer.

8. The pellicle according to claim 1, further comprising a molybdenum layer.

9. The pellicle according to claim 1, further comprising a silicon oxynitride layer.

10. The pellicle according to claim 9, further comprising a molybdenum layer and wherein the molybdenum layer is disposed between the silicon oxynitride layer and a ruthenium layer.

11. A pellicle for a lithographic apparatus, the pellicle comprising a molybdenum layer disposed between a ruthenium layer and a silicon oxynitride layer.

12. The pellicle of claim 11, wherein one or both of the molybdenum and ruthenium layers is metallic.

13. The pellicle of claim 12, wherein the silicon oxynitride layer is disposed on a silicon substrate.

14. A method of manufacturing a pellicle for a lithographic apparatus, the method comprising providing a metal oxysilicide layer as part of forming the pellicle.

15. The method according to claim 14, wherein the pellicle comprises a silicon substrate and a metallic layer, and wherein the metal oxysilicide layer is formed by heating the pellicle to a temperature below the temperature at which dewetting occurs for a first period of time.

16. The method according to claim 15 wherein the metallic layer is formed on the metal oxysilicide layer after the metal oxysilicide layer has formed.

17. The method according to claim 15, wherein the metallic layer comprises ruthenium.

18. The method according to claim 15, further comprising providing a molybdenum layer between the silicon substrate and a ruthenium layer.

19. A method of manufacturing a pellicle for a lithographic apparatus, the method comprising providing a molybdenum layer disposed between a ruthenium layer and a silicon oxynitride layer as part of forming the pellicle.

20. An assembly for a lithographic apparatus comprising a pellicle according to claim 1, a frame for supporting the pellicle and a patterning device attached to the frame.

* * * * *